Sept. 11, 1962 W. M. TURNER ET AL 3,053,981

HIGH-GAIN FREQUENCY MODULATION TUNER

Filed July 6, 1959 2 Sheets-Sheet 1

*INVENTORS*
WHEELER M. TURNER
LEONARD H. CHABOT

Sept. 11, 1962 W. M. TURNER ET AL 3,053,981

HIGH-GAIN FREQUENCY MODULATION TUNER

Filed July 6, 1959 2 Sheets-Sheet 2

INVENTORS
WHEELER M. TURNER
LEONARD H. CHABOT

United States Patent Office 3,053,981

Patented Sept. 11, 1962

3,053,981

HIGH-GAIN FREQUENCY MODULATION TUNER

Wheeler M. Turner and Leonard H. Chabot, Santa Barbara, Calif.; said Turner assignor to Security First National Bank, Los Angeles County, Calif., a national banking association Filed July 6, 1959, Ser. No. 825,178

3 Claims. (Cl. 325—344)

The present invention consists of an improved high-gain frequency modulation tuner including a radio frequency amplifier, a local oscillator, a mixer coupled to the radio frequency amplifier and the local oscillator and effectively mixing the signals received therefrom to produce an intermediate frequency signal, an intermediate frequency amplifier coupled to the mixer, a frequency discriminator coupled to the intermediate frequency amplifier, and negative feedback loop means including an amplifier coupled to said discriminator and frequency modulation means coupled to said amplifier and said local oscillator for frequency modulating the signal produced by said local oscillator in accordance with the output signal produced by said discriminator, and in a negative sense with respect to a frequency modulated signal fed from the radio frequency amplifier into the mixer, whereby to greatly reduce the requisite intermediate frequency band width requirement in a manner such as to maximize gain and sensitivity by operating substantially at the optimum value or peak of the intermediate frequency response curve, and output terminal means connected to the negative feedback loop means between the discriminator and the local oscillator (usually between the amplifier in the negative feedback loop means and the local oscillator).

It is an object of the present invention to provide an improved frequency modulation tuner of the type described above, which may be said to, in effect, trade the linearity of the FM detector or frequency discriminator for the linearity of the frequency modulation means which may, for example, comprise a reactance modulator, or the like, which is working over a much smaller percentage of its operating frequency—in other words, having the same frequency deviation with respect to the carrier frequency as the FM detector or frequency discriminator has with respect to the much lower intermediate frequency.

It is a further object to provide an improved frequency modulation tuner of the character described above which, by reason of the negative feedback loop, effectively operates over a very small and, therefore, very linear portion of the FM detector or frequency discriminator response curve.

It is a further object to provide an improved frequency modulation tuner of the character described above wherein, due to the pure frequency reacting nature of the negative feedback loop, complete limiting of output amplitude occurs. Actually, a normal FM tuner's output amplitude variations are reduced, in the improved frequency modulation tuner of the present invention, proportionate to the loop gain.

It is a further object to provide an improved frequency modulation tuner of the character described above, which operates in a manner effectively limiting intelligence signal amplitudes at very low signal strengths due to the very high open loop gain in cooperation with the tendency of the negative feedback loop to hold the intelligence signal at the fixed optimum peak point on the intermediate frequency response curve.

It is a further object to provide an improved frequency modulation tuner of the character described above, which effectively brings about optimization of the intermediate frequency response curve. This can be said to occur as a result of the gain of the negative feedback loop and the fact that it modifies frequency deviation in the intermediate frequency amplifier in a negative feedback sense, thus greatly reducing the requisite intermittent frequency band width, and resulting in the utilization of only the optimum or peak region of the intermediate frequency response curve rather than a very large broad band portion thereof, as is utilized in conventional frequency modulation tuners.

It is a further object to provide an improved frequency modulation tuner which, by reason of the negative high-gain feedback loop, results in great reduction of what may be termed the "improvement threshold."

It is a further object to provide an improved frequency modulation tuner having greatly reduced self-generated signal-to-noise ratio deterioration due to the noiseless large gain increase resulting from the use of the improved high-gain negative feedback loop means of the present invention in an FM tuner having each of the intermediate frequency amplifiers tuned in a very high-gain, narrow band width manner. This also applies to other stages, etc.

It is a further object to provide an improved frequency modulation tuner embodying complete stability of operation by reason of the high gain effective automatic frequency control provided.

It is a further object to provide an improved frequency modulation tuner which, by reason of the circuit components and interrelationships thereof, has noncritical tuning.

It is a further object to provide an improved frequency modulation tuner so arranged as to provide for great simplicity in alignment of the various stages by simple peaking of the radio frequency and intermediate frequency circuits, etc.

It is a further object to provide an improved frequency modulation tuner and/or receiver of the character set forth in any of the preceding objects which is of extremely simple, cheap, foolproof construction such as to facilitate widespread commercial use thereof.

Further objects will be apparent to persons skilled in the art after a careful study hereof.

For the purpose of clarifying the nature of the present invention, two exemplary embodiments are illustrated in the hereinbelow-described figures of the accompanying drawings, and are described in detail hereinafter.

Figure 1:
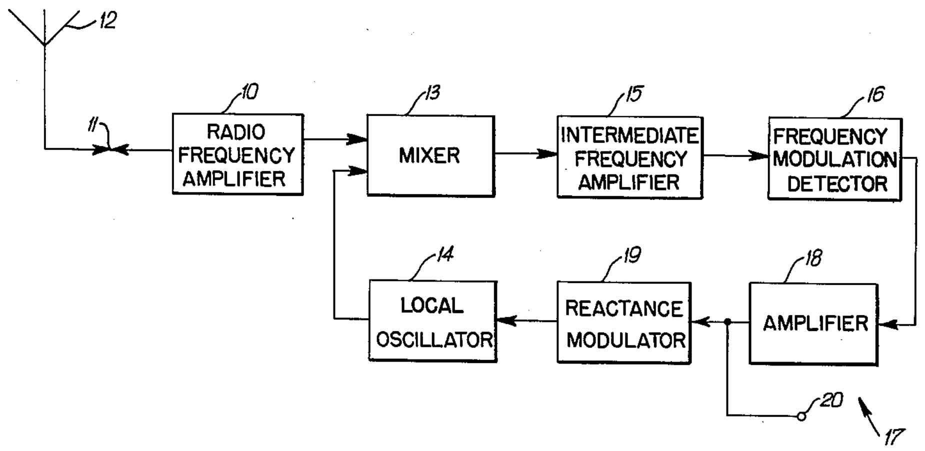
FIG. 1 is a view showing, in block diagram form, one exemplary embodiment of the present invention.

As illustrated in block diagram form in FIG. 1, one exemplary embodiment of the invention may include a radio frequency amplifier such as is indicated at 10, which, in the example illustrated, is shown coupled, as indicated at 11, to a receiving antenna, indicated at 12, whereby to comprise a frequency modulation receiver. It should be noted that tuning means for selectively controllably tuning the receiver is not shown, since such is well known in the art and does not comprise our real invention. Also, it should be noted that the antenna 12 may be eliminated and the invention may merely comprise a frequency modulation tuner, if desired. The radio frequency amplifier 10 is coupled to the mixer, indicated at 13, which also has the local oscillator 14 coupled thereto, whereby the mixer 13 will effectively mix the signals received from the radio frequency amplifier 10 and the local oscillator 14 in a manner such as to produce an intermediate frequency output signal which is fed to the intermediate frequency amplifier 15 (which may consist of one or more stages), which in turn has its output fed to the FM detector or frequency discriminator 16 (which may be a ratio detector, Foster-Seely discriminator, or other FM detector of the pulse averaging, gated pulse, or other type), which is adapted to produce an output signal varying in amplitude in a manner corresponding to the input frequency deviation fed thereinto; said output signal being effectively fed into negative feedback loop means, indicated generally at 17, consisting of an amplifier 18 and frequency modulation means, which in the specific example illustrated in FIG. 1 takes the form of a reactance modulator, indicated at 19, which effectively frequency modulates the local oscillator 14 in accordance with the amplitude of the output signal produced by the FM detector or frequency discriminator 16, and in a negative sense with respect to a frequency modulated signal fed from the radio frequency amplifier 10 into the mixer 13, whereby to greatly reduce the requisite intermediate frequency band width requirement and to thereby maximize gain and sensitivity by causing the intermediate frequency amplifier 15 to operate substantially at the optimum value or peak of the intermediate frequency response curve, and to further minimize the band width handled by the FM detector or frequency discriminator and thus greatly increase the linearity thereof.

In the specific example illustrated in FIG. 1, an output terminal means 20 is connected to the negative feedback loop means 17 between the amplifier 18 and the reactance modulator 19.

It should be noted that the exemplary form of the invention illustrated in FIG. 1 has all of the advantages set forth hereinbefore which, therefore, will not again be repeated at this point, since such would be redundant and would unnecessarily increase the length of this application.

Figure 2:
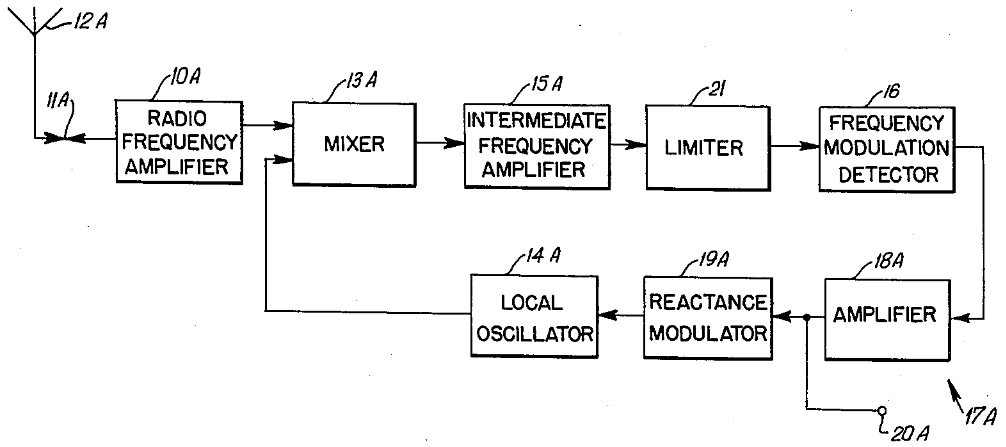
FIG. 2 is a view, in block diagram form generally similar to FIG. 1, illustrating a slight modification including a limiter stage between the intermediate frequency stage and the frequency discriminator stage.

FIG. 2 illustrates a slight modification of the block diagram form of the invention illustrated in FIG. 1, wherein similar parts are indicated by similar reference numerals followed by the letter "A." This modification additionally includes a limiter stage, indicated at 21, which effectively amplitude limits the input signal to the FM detector or frequency discriminator 16A.

Figure 3:
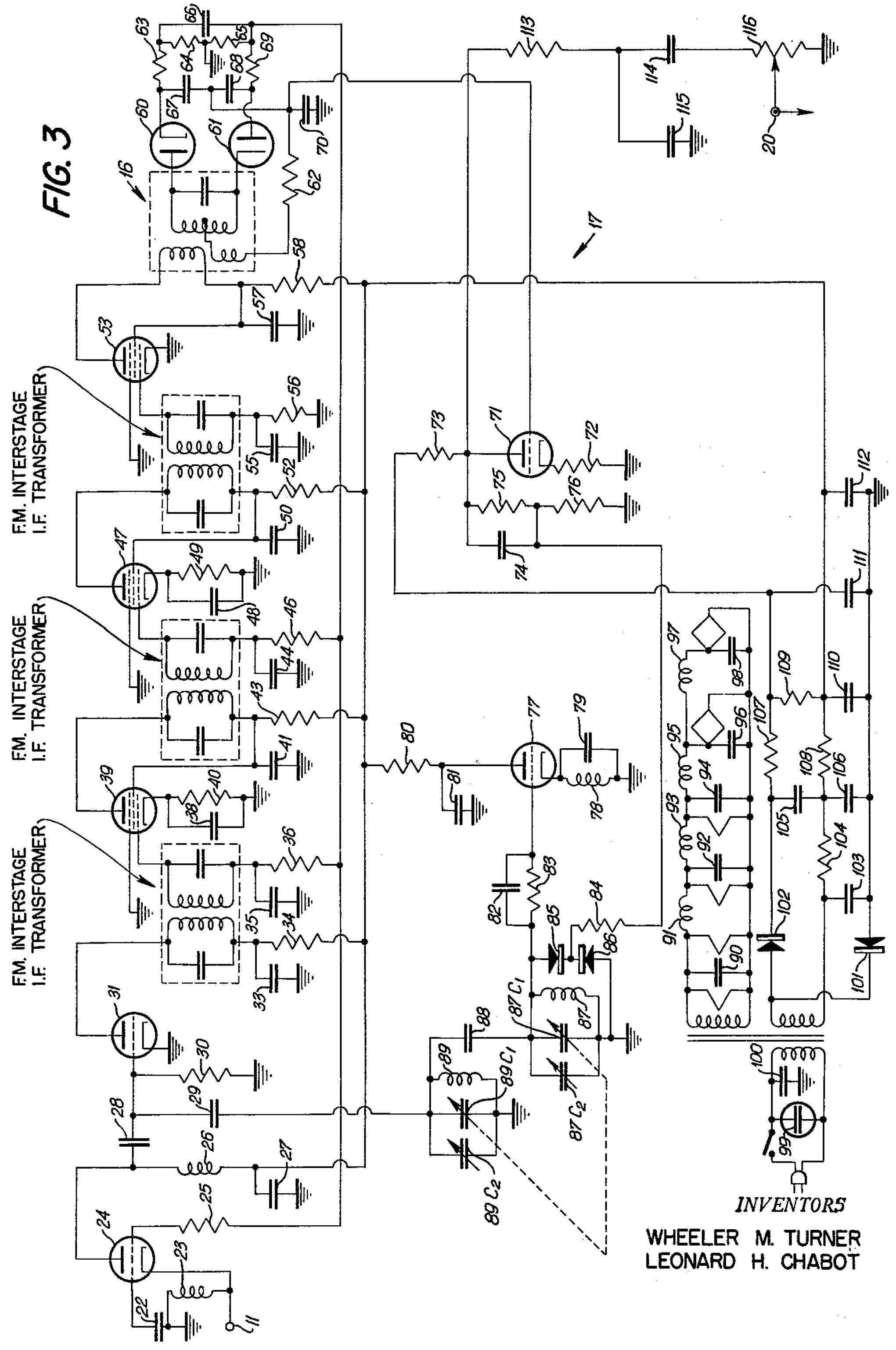
FIG. 3 is a schematic circuit diagram exemplifying a typical circuit arrangement embodying one preferred form of the present invention.

FIG. 3 illustrates, in electrical schematic circuit form, one specific example of the invention diagrammatically illustrated in FIG. 1, with the various components embodied in each of the functional circuit portions illustrated by blocks in FIG. 1 being numbered so that identification and/or electrical values typical of the components (but not limiting same) may be found in the listing which follows hereinafter. However, a detailed description of the circuit is not thought necessary, in view of the description given hereinabove of the block diagram illustrations of the present invention and in view of the fact that each of the block diagram functional circuit portions illustrated in FIGS. 1 and 2 takes an entirely conventional electrical schematic circuit form, as illustrated in FIG. 3.

A representative listing is set forth hereinbelow identifying and giving electrical values of various of the circuit components shown in FIG. 3:

| Reference numeral identifying circuit component: | Value of predominant electrical characteristic of circuit component |
|---|---|
| 22 | 0.001 microfarad. |
| 23 | 1.0 microhenry. |
| 24 | 12AT7. |
| 25 | 10,000 ohms. |
| 26 | 1.0 microhenry. |
| 27 | 0.01 microfarad. |
| 28 | 47.0 micromicrofarads. |
| 29 | 0.001 microfarad. |
| 30 | 3.3 megohms. |
| 31 | 12AT7. |
| 33 | 0.01 microfarad. |
| 34 | 1,000 ohms. |
| 35 | 0.01 microfarad. |
| 36 | 10,000 ohms. |
| 38 | 0.01 microfarads. |
| 39 | 6BA6. |
| 40 | 150 ohms. |
| 41 | 0.01 microfarad. |
| 43 | 1,000 ohms. |
| 44 | 0.01 microfarad. |
| 46 | 10,000 ohms. |
| 47 | 6AU6. |
| 48 | 0.01 microfarad. |
| 49 | 150 ohms. |
| 50 | 0.01 microfarad. |
| 52 | 1,000 ohms. |
| 53 | 6AU6. |
| 55 | 47.0 micromicrofarads. |
| 56 | 100,000 ohms. |
| 57 | 0.01 microfarad. |
| 58 | 1,000 ohms. |
| 16 | Miller 1465, 10.7 M.C., F.M., I.F. ratio detector. |
| 60 | 6AL5. |
| 61 | 6AL5. |
| 62 | 68.0 ohms. |
| 63 | 1,000 ohms. |
| 64 | 6,800 ohms. |
| 65 | 6,800 ohms. |
| 66 | 5.0 microfarads. |
| 67 | 300 microfarads. |
| 68 | 300 microfarads. |
| 69 | 1,500 ohms. |
| 70 | 100 microfarads. |
| 71 | 12AT7. |
| 72 | 2,700 ohms. |
| 73 | 100,000 ohms. |
| 74 | 0.05 microfarad. |
| 75 | 2.2 megohms. |
| 76 | 220,000 ohms. |
| 77 | 12AT7. |
| 78 | 1.0 microhenry. |
| 79 | 10.0 micromicrofarads. |
| 80 | 1,000 ohms. |
| 81 | 0.001 microfarad. |
| 82 | 100 microfarads. |
| 83 | 10,000 ohms. |
| 84 | 10 megohms. |
| 85 | Silicon diode variable capacitor (Reactance). |
| 86 | Silicon diode variable capacitor (Modulator). |
| 87 | 0.16 microhenry. |
| 87C1 | 2 to 25 micromicrofarads. |
| 87C2 | 2 to 25 micromicrofarads. |
| 88 | 2.0 micromicrofarads. |
| 89 | 0.19 microhenry. |
| 89C1 | 2 to 25 micromicrofarads. |
| 89C2 | 2 to 25 micromicrofarads. |
| 90 | 0.01 microfarad. |
| 91 | 1.0 microhenry. |
| 92 | 0.01 microfarad. |
| 93 | 1.0 microhenry. |
| 94 | 0.01 microfarad. |
| 95 | 1.0 microhenry. |
| 96 | 0.01 microfarad. |
| 97 | 1.0 microhenry. |
| 98 | 0.01 microfarad. |
| 99 | A.C. outlet. |
| 100 | 0.05 microfarad. |
| 101 | Rectifier. |
| 102 | Rectifier. |
| 103 | 40.0 microfarads. |
| 104 | 330 ohms. |
| 105 | 20.0 microfarads. |
| 106 | 40.0 microfarads. |
| 107 | 10,000 ohms. |
| 108 | 330 ohms. |
| 109 | 47,000 ohms. |
| 110 | 40.0 microfarads. |
| 111 | 40.0 microfarads. |
| 112 | 0.01 microfarad. |
| 113 | 47,000 ohms. |
| 114 | 0.05 microfarad. |
| 115 | 0.0015 microfarad. |
| 116 | 500,000 ohms. |

It should be noted that a slightly modified form of the block diagram arrangement illustrated in FIG. 2 may comprise a very effective high-gain amplitude modulation tuner and/or receiver and that one such arrangement is described, illustrated, and claimed in detail in Patent No. 2,961,537.

It should be understood that the figures and the specific description thereof set forth in this application are for the purpose of illustrating the present invention and are not to be construed as limiting the present invention to the precise and detailed specific structure shown in the figures and specifically described hereinbefore. Rather, the real invention is intended to include substantially equivalent constructions embodying the basic teachings and inventive concept of the present invention.

We claim:

1. An improved high-gain frequency modulation tuner comprising: radio frequency amplifier means; local oscillator means; mixer means coupled to said radio frequency amplifier means and said local oscillator means and effectively mixing the signals received therefrom to produce an unmodified intermediate frequency signal having an unmodified maximum modulation frequency deviation, thus producing an unmodified maximum bandwidth of the unmodified intermittent frequency signal; intermediate frequency amplifier means coupled to the mixer means and tuned in a very high-gain, narrow band-width manner having an effective band-pass width of less than one-fifth of the unmodified maximum band-width of the unmodified intermittent frequency signal; frequency discriminator means coupled to said intermediate frequency amplifier means; negative feedback loop means including amplifier means at the input thereto and frequency modulation means coupled to said frequency discriminator means and said local oscillator means for frequency modulating the output signal produced by said local oscillator means in accordance with the amplitude of the output signal produced by said discriminator means in a negative sense with respect to a frequency modulated signal received by the radio frequency amplifier means and fed therefrom into said mixer means, whereby to modify and greatly reduce the unmodified maximum band-width of the unmodified intermittent frequency signal to a band-width of less than one-fifth of its unmodified maximum band width and to correspondingly modify and greatly reduce the requisite intermediate frequency band-width requirement of the intermediate frequency amplifier means to correspond to said tuning thereof in said high-gain, narrow band-width manner having an effective band-pass width of less than one-fifth of the unmodified maximum band-width of the unmodified intermediate frequency signal, and to correspondingly maximize gain and sensitivity by operating substantially at the peak of the intermediate frequency response curve of the high-gain, narrow band-width tuned intermediate frequency amplifier means.

2. An improved high-gain frequency modulation tuner comprising: radio frequency amplifier means; local oscillator means; mixer means coupled to said radio frequency amplifier means and said local oscillator means and effectively mixing the signals received therefrom to produce an unmodified intermediate frequency signal having an unmodified maximum modulation frequency deviation, thus producing an unmodified maximum band-width of the unmodified intermittent frequency signal; intermediate frequency amplifier means coupled to the mixer means and tuned in a very high-gain, narrow band-width manner having an effective band-pass width of less than one-fifth of the unmodified maximum band-width of the unmodified intermittent frequency signal; frequency discriminator means coupled to said intermediate frequency amplifier means; negative feedback loop means including amplifier means at the input thereto and frequency modulation means comprising reactance modulator means coupled to said frequency discriminator means and said local oscillator means for frequency modulating the output signal produced by said local oscillator means in accordance with the amplitude of the output signal produced by said discriminator means in a negative sense with respect to a frequency modulated signal received by the radio frequency amplifier means and fed therefrom into said mixer means, whereby to modify and greatly reduce the unmodified maximum band-width of the unmodified intermittent frequency signal to a band-width of less than one-fifth of its unmodified maximum band width and to correspondingly modify and greatly reduce the requisite intermediate frequency band-width requirement of the intermediate frequency amplifier means to correspond to said tuning thereof in said high-gain, narrow band-width manner having an effective band-pass width of less than one-fifth of the unmodified maximum band-width of the unmodified intermediate frequency signal, and to correspondingly maximize gain and sensitivity by operating substantially at the peak of the intermediate frequency response curve of the high-gain, narrow band-width tuned intermediate frequency amplifier means; and output terminal means connected to said negative feedback loop means.

3. An improved high-gain frequency modulation tuner comprising: radio frequency amplifier means; local oscillator means; mixer means coupled to said radio frequency amplifier means and said local oscillator means and effectively mixing the signals received therefrom to produce an unmodified intermediate frequency signal having an unmodified maximum modulation frequency deviation, thus producing an unmodified maximum band-width of the unmodified intermittent frequency signal; intermediate frequency amplifier means coupled to the mixer means and tuned in a very high-gain, narrow band-width manner having an effective band-pass width of less than one-fifth of the unmodified maximum band-width of the unmodified intermittent frequency signal; amplitude limiter means coupled to said intermediate frequency amplifier means; frequency discriminator means coupled to said amplitude limiter means; negative feedback loop means including amplifier means at the input thereto and frequency modulation means coupled to said frequency discriminator means and said local oscillator means for frequency modulating the output signal produced by said local oscillator means in accordance with the amplitude of the ouput signal produced by said discriminator means in a negative sense with respect to a frequency modulated signal received by the radio frequency amplifier means and fed therefrom into said mixer means, whereby to modify and greatly reduce the unmodified maximum band-width of the unmodified intermittent frequency signal to a band-width of less than one-fifth of its unmodified maximum band width and to correspondingly modify and greatly reduce the requisite intermediate frequency band-width requirement of the intermediate frequency amplifier means to correspond to said tuning thereof in said high-gain, narrow band-width manner having an effective band-pass width of less than one-fifth of the unmodified maximum band-width of the unmodified intermediate frequency signal, and to correspondingly maximize gain and sensitivity by operating substantially at the peak of the intermediate frequency response curve of the high-gain, narrow band-width tuned intermediate frequency amplifier means; and output terminal means connected to said negative feedback loop means between the amplifier means and the frequency modulation means.

References Cited in the file of this patent

UNITED STATES PATENTS

| | | |
|---|---|---|
| 2,075,503 | Chaffee | Mar. 30, 1937 |
| 2,272,401 | Chaffee | Feb. 10, 1942 |
| 2,273,110 | Kimball | Feb. 17, 1942 |
| 2,497,841 | Seeley | Feb. 14, 1950 |
| 2,502,154 | Jeffers | Mar. 28, 1950 |
| 2,869,080 | Bycer | Jan. 13, 1959 |
| 2,897,352 | Smith-Vaniz | July 28, 1959 |
| 2,936,428 | Schweitzer | May 10, 1960 |

OTHER REFERENCES

Article, "Varicap" used as variable reactor in AFC system, pages 57–59 of Electronics for May 1958.